(12) United States Patent
Briggs et al.

(10) Patent No.: US 11,088,070 B2
(45) Date of Patent: Aug. 10, 2021

(54) METHOD OF FORMING A MULTI-LEVEL INTERCONNECT STRUCTURE IN A SEMICONDUCTOR DEVICE

(71) Applicant: IMEC vzw, Leuven (BE)

(72) Inventors: Basoene Briggs, Heverlee (BE); Vladimir Machkaoutsan, Wezemaal (BE); Zsolt Tokei, Leuven (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/936,271

(22) Filed: Jul. 22, 2020

(65) Prior Publication Data

US 2021/0028106 A1  Jan. 28, 2021

(30) Foreign Application Priority Data

Jul. 23, 2019  (EP) ..................... 19187767

(51) Int. Cl.
*H01L 21/768* (2006.01)
*H01L 23/522* (2006.01)
(Continued)

(52) U.S. Cl.
CPC .... *H01L 23/5226* (2013.01); *H01L 21/76808* (2013.01); *H01L 21/76813* (2013.01);
(Continued)

(58) Field of Classification Search
CPC ............. H01L 21/768; H01L 21/76808; H01L 21/76813; H01L 21/76877; H01L 21/76883; H01L 21/76898; H01L 21/76816; H01L 21/3205; H01L 21/52155; H01L 21/823475; H01L 21/823871;
(Continued)

(56) References Cited

U.S. PATENT DOCUMENTS 9,373,582 B1  6/2016  Feurprier et al.
10,312,188 B1  6/2019  Srivastava et al.
(Continued)

OTHER PUBLICATIONS

Extended European Search Report, dated Jan. 31, 2020, in counterpart EP Application No. 19187767.9.

*Primary Examiner* — Chuong A Luu
(74) *Attorney, Agent, or Firm* — Knobbe Martens Olson & Bear LLP

(57) ABSTRACT

A method of forming a multi-level interconnect structure in a semiconductor device is disclosed. In one aspect, the device includes a first interconnection level including a first dielectric layer and a first conductive structure; a second interconnection level including a second dielectric layer and a second conductive structure; and a third interconnection level including a third dielectric layer and a third conductive structure. The method includes forming a trench in the third dielectric layer; providing a first sacrificial material in the trench; and thereafter forming a via extending through the third interconnection level to the second conductive structure; providing a second sacrificial material in the via; forming a multi-level via extending through the third interconnection level to the first conductive structure; removing the first and second sacrificial materials; and depositing a conductive material at least partially filling: the trench; the via; and the multi-level via.

14 Claims, 9 Drawing Sheets

(51) Int. Cl.
*H01L 23/528* (2006.01)
*H01L 23/532* (2006.01)

(52) U.S. Cl.
CPC ...... *H01L 23/528* (2013.01); *H01L 23/53209* (2013.01); *H01L 23/53295* (2013.01)

(58) Field of Classification Search
CPC ... H01L 23/522; H01L 23/528; H01L 23/532; H01L 23/481; H01L 23/535; H01L 23/538; H01L 23/5221; H01L 23/5386; H01L 23/5226; H01L 23/53209; H01L 23/53295
USPC ........................................................ 438/622
See application file for complete search history.

(56) References Cited

U.S. PATENT DOCUMENTS

| | | | |
|---|---|---|---|
| 2005/0116318 A1* | 6/2005 | Park | H01L 28/91 257/532 |
| 2008/0029811 A1* | 2/2008 | Yun | H01L 29/0653 257/330 |
| 2016/0172359 A1* | 6/2016 | Yoon | H01L 29/785 257/401 |
| 2018/0130699 A1 | 5/2018 | Zhang et al. | |
| 2018/0226294 A1 | 8/2018 | Stephens et al. | |
| 2018/0342454 A1 | 11/2018 | Zhang et al. | |

* cited by examiner

METHOD OF FORMING A MULTI-LEVEL INTERCONNECT STRUCTURE IN A SEMICONDUCTOR DEVICE

CROSS-REFERENCE TO RELATED APPLICATIONS

This application claims foreign priority to European Patent Application No. 19187767.9, filed Jul. 23, 2019, the contents of which are incorporated by reference herein in its entirety.

BACKGROUND

Technological Field

The disclosed technology relates to a method of forming a multi-level interconnect structure in a semiconductor device.

Description of the Related Technology

Processes for manufacturing multi-level interconnect structures, also known as supervias, are known in the art. Such processes may include the formation of both standard interconnect structures, i.e. vias, and multi-level interconnect structures, supervias. Traditionally, the process includes dual-damascene patterning and partial etching of the supervia and via, and subsequently a complete etch of the supervia and via along with a trench in a single step. As a result, the interface between the vias and the trench are chamfered, i.e. chamfered edges are formed. This causes undesired increase of the critical dimension (CD) of the top part of the vias, as well as reduction of the distance between the patterned features. Increase of CD causes unpredictable increase in via resistance variability, and reduced distance between features increases risk of dielectric breakdown and time-dependent dielectric breakdown (TDDB) failure.

There is a need for improved methods for forming multi-level interconnect structures with improved properties with respect to chamfering.

SUMMARY OF CERTAIN INVENTIVE ASPECTS

It is an object of the disclosed technology to mitigate, alleviate or eliminate one or more of the above-identified deficiencies in the art and disadvantages singly or in combination.

According to a first aspect of the disclosed technology, these and other objects are achieved in full, or at least in part, by a method of forming a multi-level interconnect structure in a semiconductor device including: a first interconnection level including a first dielectric layer and a first conductive structure; a second interconnection level arranged above the first interconnection level and including a second dielectric layer and a second conductive structure; a third interconnection level arranged above the second interconnection level and including a third dielectric layer and a third conductive structure; wherein the method includes: forming a trench in the third dielectric layer; providing a first sacrificial material in the trench; and thereafter forming a via extending through the third interconnection level to the second conductive structure; providing a second sacrificial material in the via; forming a multi-level via extending through the third interconnection level to the first conductive structure; removing the first sacrificial material; removing the second sacrificial material; depositing a conductive material at least partially filling: the trench, thereby forming the third conductive structure; the via, thereby forming a via structure forming an electrical connection between the third conductive structure and the second conductive structure; and the multi-level via, thereby forming a multi-level via structure forming an electrical connection between the third conductive structure and the first conductive structure.

In general, the disclosed technology is based on the realization that the trench can be formed before formation of vias and multi-level vias, and a sacrificial material can be provided in the trench to protect the interface between the trench and the vias, thus decreasing chamfering.

Throughout the present disclosure, the term via structure is used to refer to a normal via, i.e. an interconnect structure extending from a metal layer $M_x$ to a metal layer $M_{x-1}$, while the term multi-level via structure is used to refer to a multi-level interconnect structure, i.e. an interconnect structure extending from a metal layer $M_x$ to a metal layer $M_{x-2}$ or further. Multi-level via structures have a relatively high aspect ratio (i.e. ratio of vertical-to-width dimension) as compared to normal via structures.

Furthermore, throughout the present disclosure reference is made to steps of "forming". It is to be understood that, although not explicitly mentioned, such steps may include forming a mask layer, patterning the mask layer, developing the mask layer, deposition of material, and/or etching of material. Furthermore, such steps may include self-aligned multi patterning methods and/or steps, such as Self Aligned Dual Patterning (SADP), Self Aligned Quadruple Patterning (SAQP), Self Aligned Octuple Patterning (SAOP) etc., which may enable pitch division.

By "interconnection level" is hereby meant a level, or a tier, of an interconnect structure. The first through third interconnection levels may form consecutive levels of the semiconductor device, i.e. the second interconnection level may be formed directly on the first interconnection level and the third interconnection level may be formed directly on the second interconnection level. However, it is also envisioned that there may exist one or several intermediate interconnection levels between the first and second interconnection level, i.e. the multi-level via structure may extend through more than one interconnection level, such as between a metal layer $M_x$ and a metal layer $M_{x-2}$, a metal layer $M_{x-3}$, or a metal layer $M_{x-4}$, and so on. It should further be noted that the first interconnection level need not necessarily be a lower most interconnection level of the semiconductor device but one or more further interconnection levels may be present below the first interconnection level.

Each interconnection level includes conductive structures. A set of conductive structures may include horizontal conductive paths or lines arranged in a common horizontal plane. The conductive lines of each interconnection level may be arranged to provide a horizontal routing of (electrical) signals, i.e. a routing within the common horizontal plane. As used herein, the term "horizontal" in relation to a plane or a direction denotes a direction or plane being parallel to a main plane of extension of any of the interconnection levels.

The semiconductor device may be supported by or include a substrate wherein the term "horizontal" direction or "horizontal" plane equivalently may be understood as a direction parallel to a main plane of extension or a main surface of the substrate. The conductive structures may include vertical conductive vias and/or multi-level vias. The vertical conductive vias and/or multi-level vias may be arranged to provide vertical routing of signals, i.e. routing between different interconnection levels. As used herein, the term "vertical" in relation to a direction or plane denotes a direction or plane being perpendicular to a horizontal direction or horizontal plane, i.e. the term "vertical" direction or "vertical plane" denotes a direction or plane being perpendicular to a main plane of extension of any of the interconnection levels, or to (a main surface of) a substrate supporting or comprised by the semiconductor device.

By a first feature such as a layer, a level or other structure, being formed "on" a second feature such as a layer, a level or other structure, is hereby meant that the first feature may be formed directly on the second feature, i.e. in abutment with the second feature, or with one or more layers or structures intermediate the first and the second feature, i.e. not in direct contact with the second feature, unless explicitly stated otherwise.

The dielectric material may be a low-k dielectric material. The dielectric material may also be a C-containing low-K material.

Dielectric material etch rate and mask material etch rate ratio is preferably 30:1 or greater, but other ratios can be suitably implemented.

The conductive structures and via structures, including multi-level via structures, of each interconnection level may be made of a conductive material, preferably a metal material, such as aluminum, cobalt, copper, tungsten or ruthenium, or combinations thereof. The conductive material may be deposited in trenches and via holes formed in the dielectric layer of the respective interconnection level, for instance by electro-plating, chemical vapor deposition (CVD) or atomic layer deposition (ALD), or physical vapor deposition (PVD).

By the term "via" is hereby meant the empty space defined by surrounding material, and by the term "via structure", in contrast, is hereby meant the structure formed by providing material in the via, i.e. empty space. For example, a conductive material, such as a metal, may be provided in the via. The term trench and multi-level via are to be interpreted similarly.

The multi-level via may be spatially separated from the via.

By forming the trench and providing the first sacrificial material in the trench before forming the via and multi-level via, the edges of the trench may be protected. In particular the interface between the trench and the via and multi-level via may be protected, which may decrease chamfering of the edges of the trench, via, and/or multi-level via.

The step of forming the multi-level via may be performed after the step of forming the via. By forming the multi-level via after the step of forming the via, it is not necessary to provide sacrificial material in the multi-level via. Instead, the process may continue by removing the first and second sacrificial material from the trench and via respectively, and then deposit conductive material in the respective voids, i.e. the trench, the via and the multi-level via. Preferably, the deposition of conductive material is made in the trench, the via and the multi-level via in a single step. Other embodiments are possible.

Since it may be difficult to strip sacrificial material from a feature having a high aspect ratio, i.e. a multi-level via, it may be advantageous to form the via before the multi-level via, and provide a second sacrificial material in the via, but not in the multi-level via, as discussed in the section above.

Forming the via may include etching to an etch stop arranged on the second conductive structure, and the method may further include removing the etch stop to expose the underlying second conductive structure.

Forming the multi-level via may include etching to an etch stop arranged on the first conductive structure, and the method may further include removing the etch stop to expose the underlying first conductive structure. An etch stop may also be present at the second interconnection level, as discussed in the previous paragraph. Forming the multi-level via may accordingly include removing any etch stop present between the first interconnection level and the third interconnection level.

The first and second sacrificial material may be the same type of material. The sacrificial material may be a spin-on-carbon material, or a spin-on-glass material, or a combination of both. SoC may be particularly advantageous in that it fills cavities and self-planarizes, while SoG acts as an interfacing layer between a photo resist stack and the SoC. The SoG may be etched simultaneously with the dielectric material of the semiconductor, if the SoG and dielectric material have similar or comparable etch rates. In such a case, it is not required to perform a separate step to strip the SoG.

The step of depositing the conductive material may be performed in a single step.

The third conductive structure may include a first and a second conductive path. The first and second conductive path may be separated and/or isolated from each other within the third interconnection level. In other words, the first and second conductive path may not communicate electrical signals between each other without passing the electrical signals outside of the third interconnection level.

The via structure may form an electrical connection between the first conductive path and the second conductive structure, and the multi-level via structure may form an electrical connection between the second conductive path and the first conductive structure.

Other objectives, features and advantages of the disclosed technology will appear from the present disclosure.

Generally, all terms used in the claims are to be interpreted according to their ordinary meaning in the technical field, unless explicitly defined otherwise herein. Further, the use of terms "first", "second", and "third", and the like, herein do not denote any order, quantity, or importance, but rather are used to distinguish one element from another. All references to "a/an/the [element, device, component, means, step, etc.]" are to be interpreted openly as referring to at least one instance of said element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

The above, as well as additional objects, features and advantages of the disclosed technology, will be better understood through the following illustrative and non-limiting detailed description, with reference to the appended drawings. In the drawings like reference numerals will be used for like elements unless stated otherwise.

The figures are not necessarily to scale, and generally only show parts that are necessary in order to elucidate the disclosed technology, wherein other parts may be omitted or merely suggested.

DETAILED DESCRIPTION OF CERTAIN ILLUSTRATIVE EMBODIMENTS

A method of forming a multi-level interconnect structure in a semiconductor device will now be described with reference to FIGS. 1-18. It may be noted that some of the illustrated steps may be optional, and that some process steps may have been omitted for the sake of brevity. In particular, masking and patterning steps may be omitted from the figures and/or the following disclosure, since the person skilled in the art is aware of how such processing steps are carried out in the context of the disclosed technology.

It should be further noted that the multi-level interconnect structure may extend laterally or horizontally beyond the illustrated portions. It should further be noted that, owing to the schematic nature of the drawings, the relative dimensions of the various structures and layers are not drawn to scale. Rather the dimensions have been adapted for illustrational clarity and to facilitate understanding of the following description.

Figure 1:
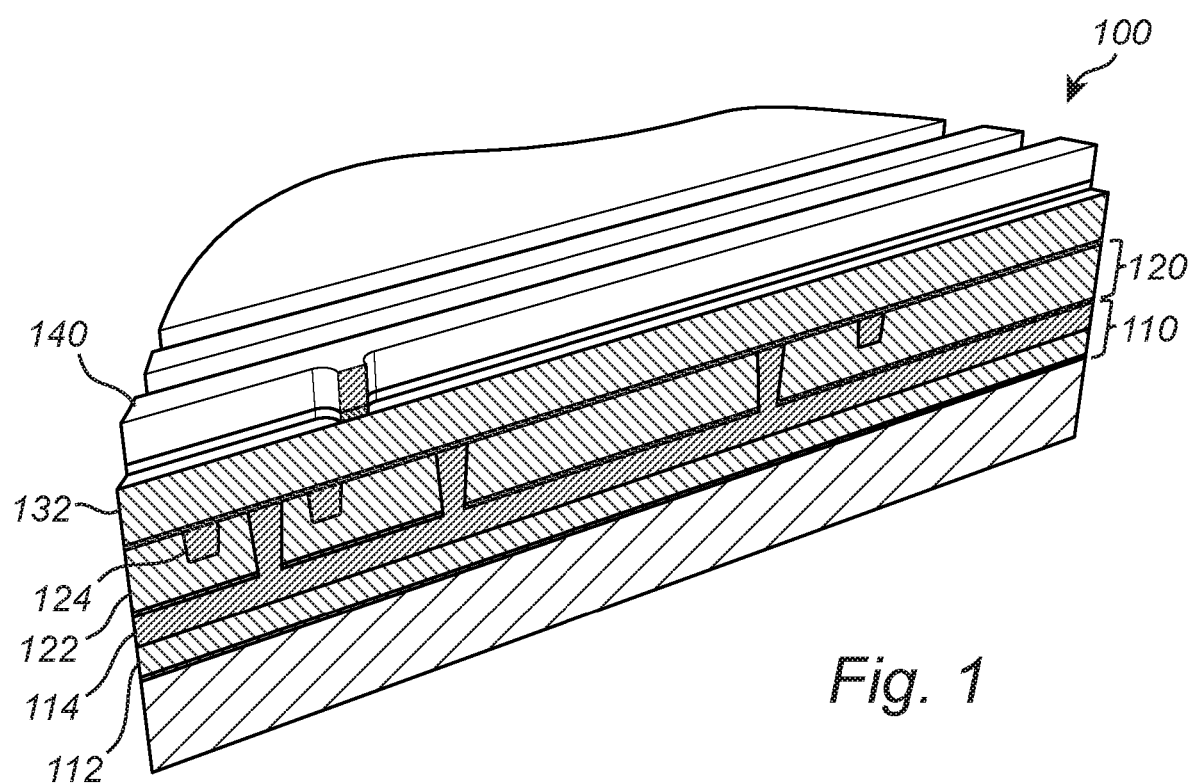
FIGS. 1-18 illustrate in a schematic, cross-sectional perspective view, steps of a method of forming a multi-level interconnect structure in a semiconductor device in accordance with an example of the disclosed technology.

FIG. 1 illustrates a semiconductor device 100. It may be noted that this figure illustrates an incomplete semiconductor device 100, and hence all features of the semiconductor device 100 are not visible.

The semiconductor device 100 here includes a first interconnection level 110 including a first dielectric layer 112 and a first conductive structure 114, and a second interconnection level 120 arranged above the first interconnection level 110 and including a second dielectric layer 122 and a second conductive structure 124.

The third interconnection level is not yet complete, only a third dielectric layer 132 is arranged above the second interconnection level 120. A trench mask 140 is formed and patterned above the third dielectric layer 132.

Figure 2:
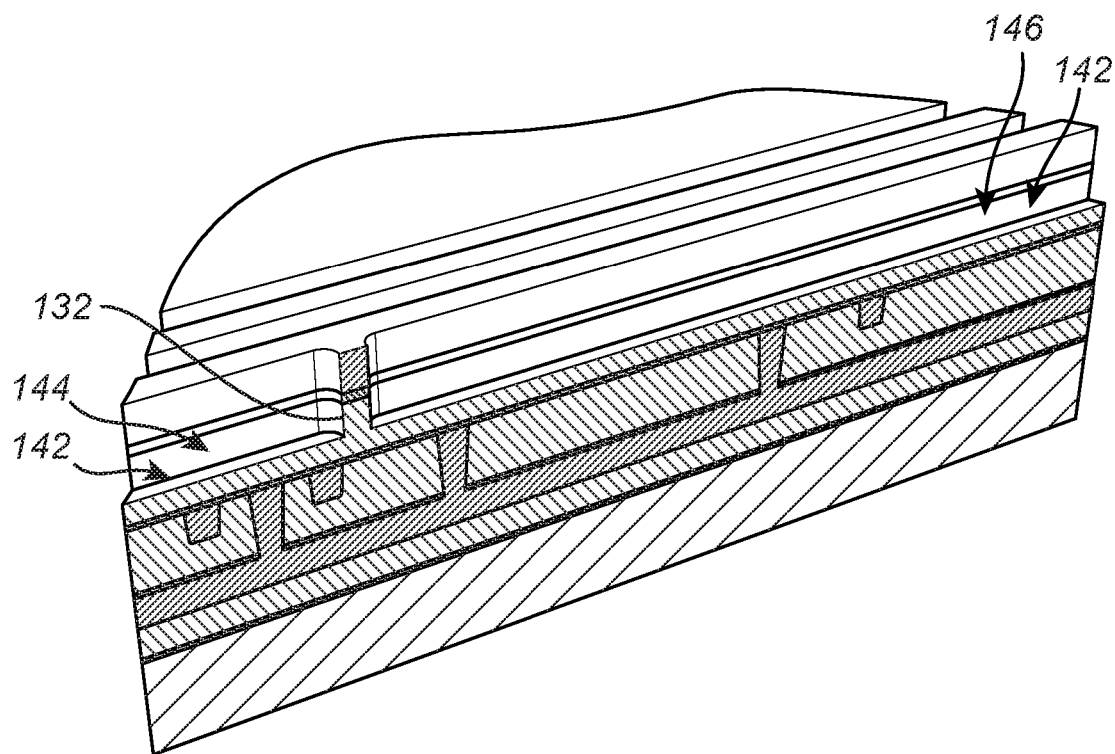

Referring now to FIG. 2, a trench 142 is formed in the third dielectric layer 132. It may be noted that the illustrated trench 142 includes a first sub-trench 144 and a second sub-trench 146. The sub-trench 144 and sub-trench 146 are separated by the third dielectric layer 132.

Figure 3:
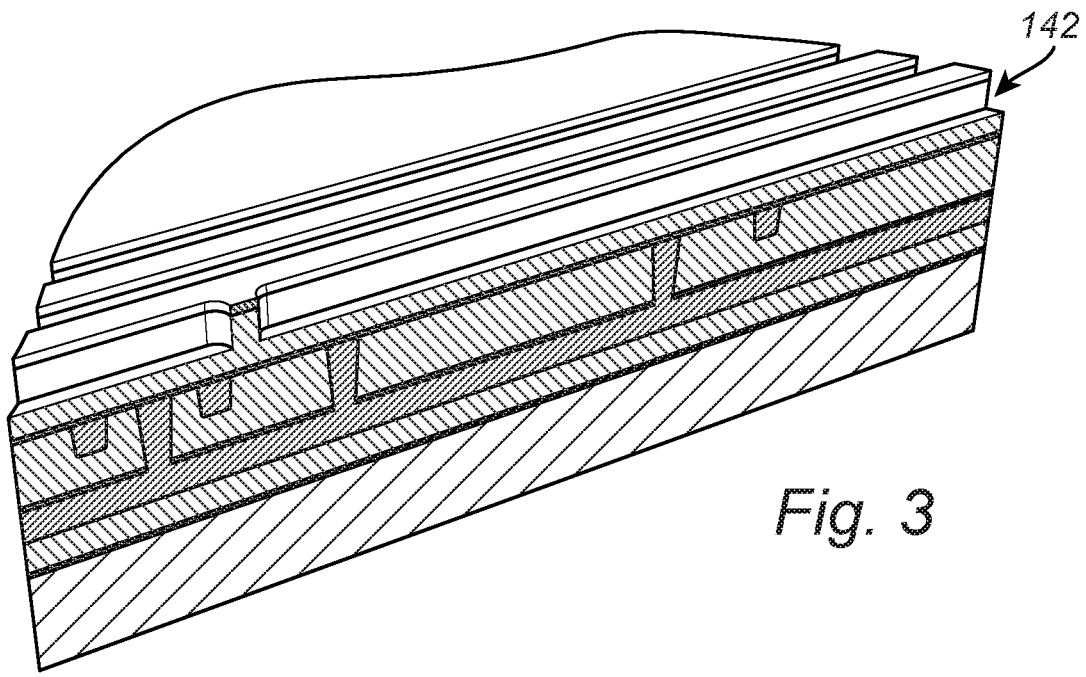
Figure 4:
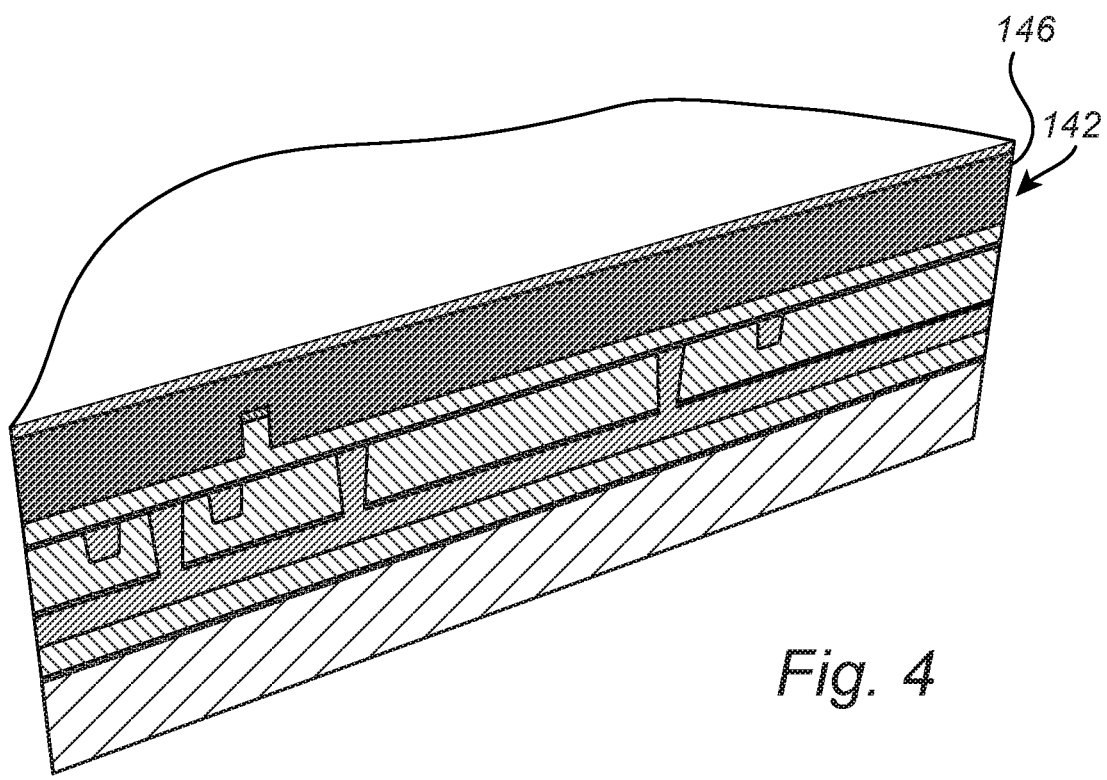
Figure 5:
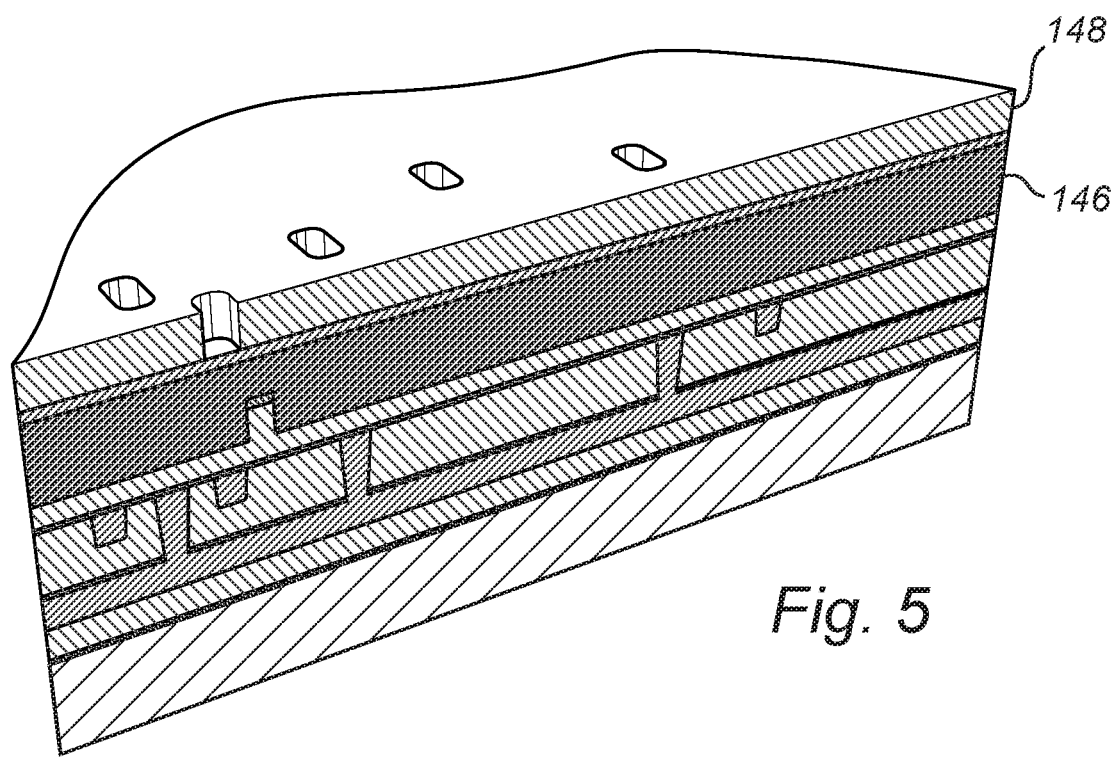

Referring now to FIGS. 3-5, the trench mask 140 has been removed. A first sacrificial material 146 is provided in the trench 142. The first sacrificial material 146 may be provided so that the trench 142 is protected during subsequent processing steps. A via mask 148 is then formed above the first sacrificial material 146.

Figure 6:
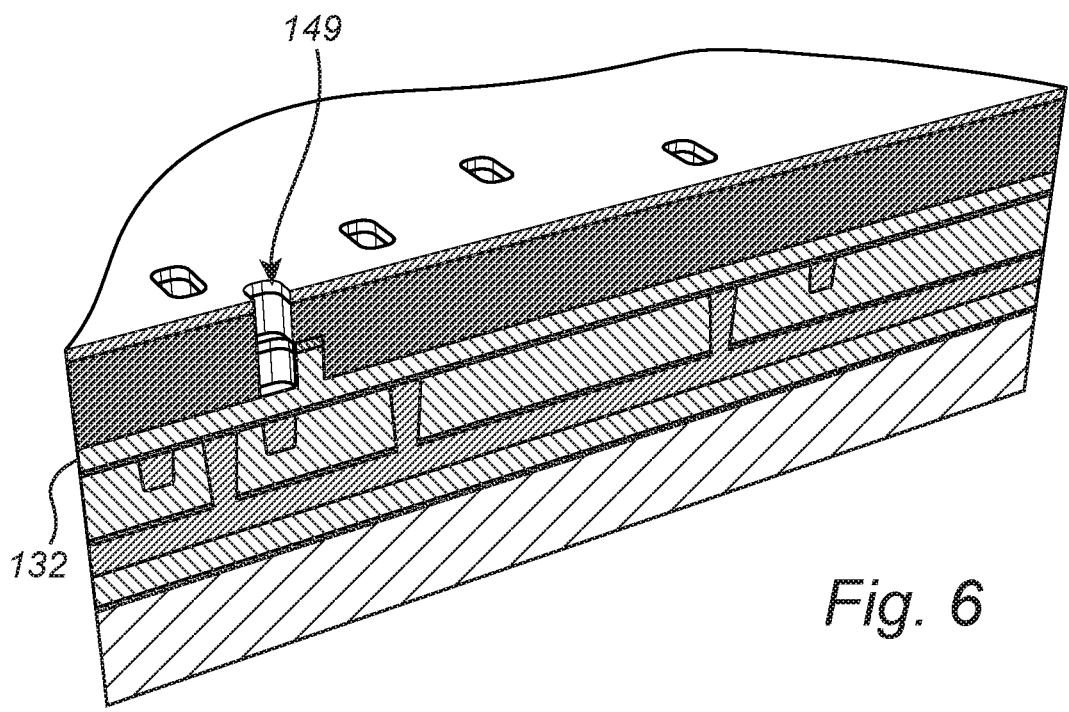
Figure 7:
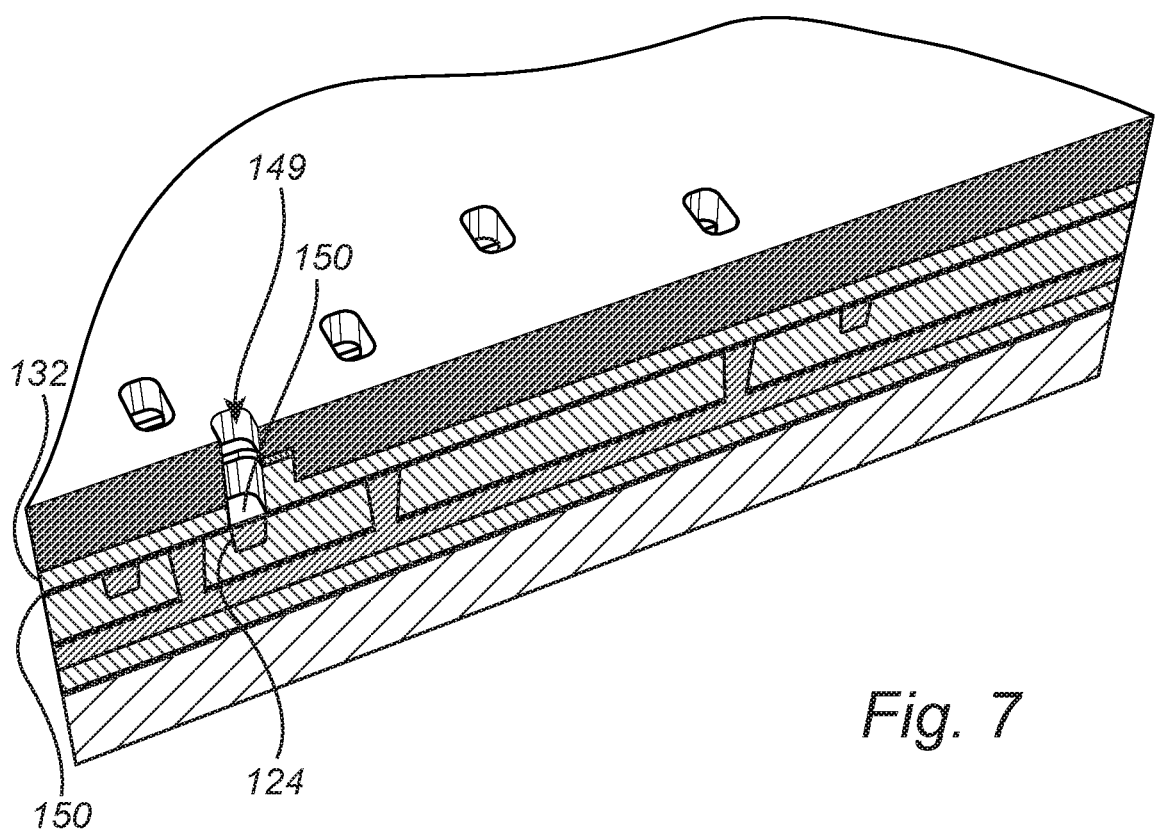

Referring now to FIGS. 6 and 7, a via 149 is formed. The forming of the via 149 includes etching of the third dielectric layer 132 to an etch stop 150 arranged on the second conductive structure 124.

Figure 8:
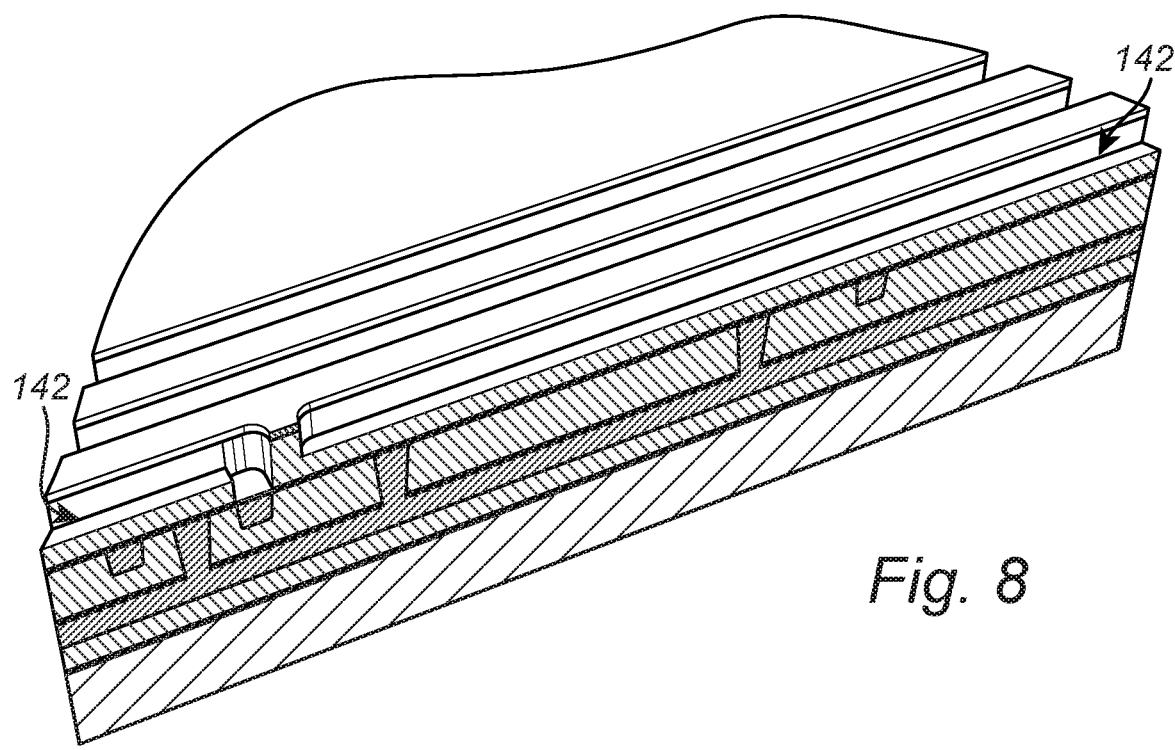
Figure 9:
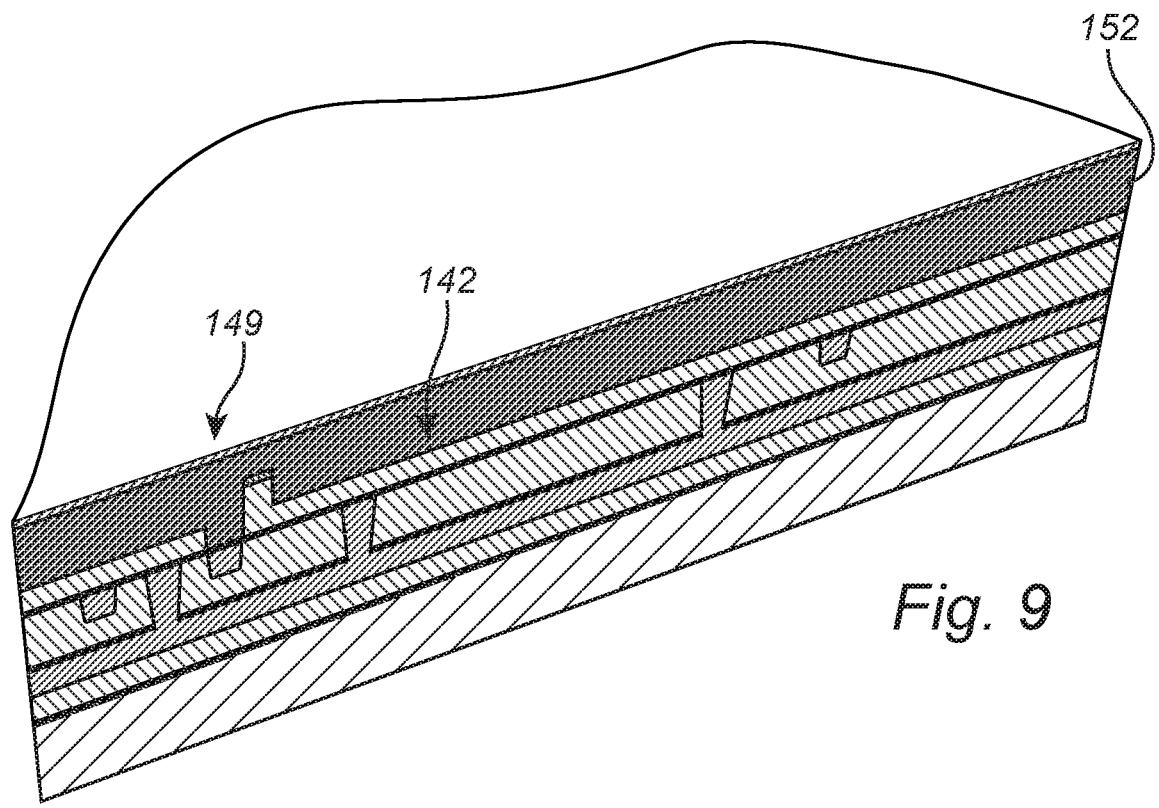

Referring now to FIGS. 8 and 9, the first sacrificial material is removed from the trench 142, before filling the trench again with sacrificial material. For the sake of achieving improved multi-level via structures with respect to chamfering, it is not necessary to maintain the same sacrificial material in the trench during the process of forming the multi-level via structures. As long as a sacrificial material is provided in the trench during the step of forming the multi-level via, the interface between the trench and the multi-level via may be protected by sacrificial material.

In view of the above, the removal of the first sacrificial material from the trench 142, followed by the provision of a second sacrificial material 152 in the via 149 and the trench 142, may achieve the same effect with respect to improved chamfer properties as maintaining the first sacrificial material in the trench and providing the second sacrificial material 152 in the via 149.

Figure 10:
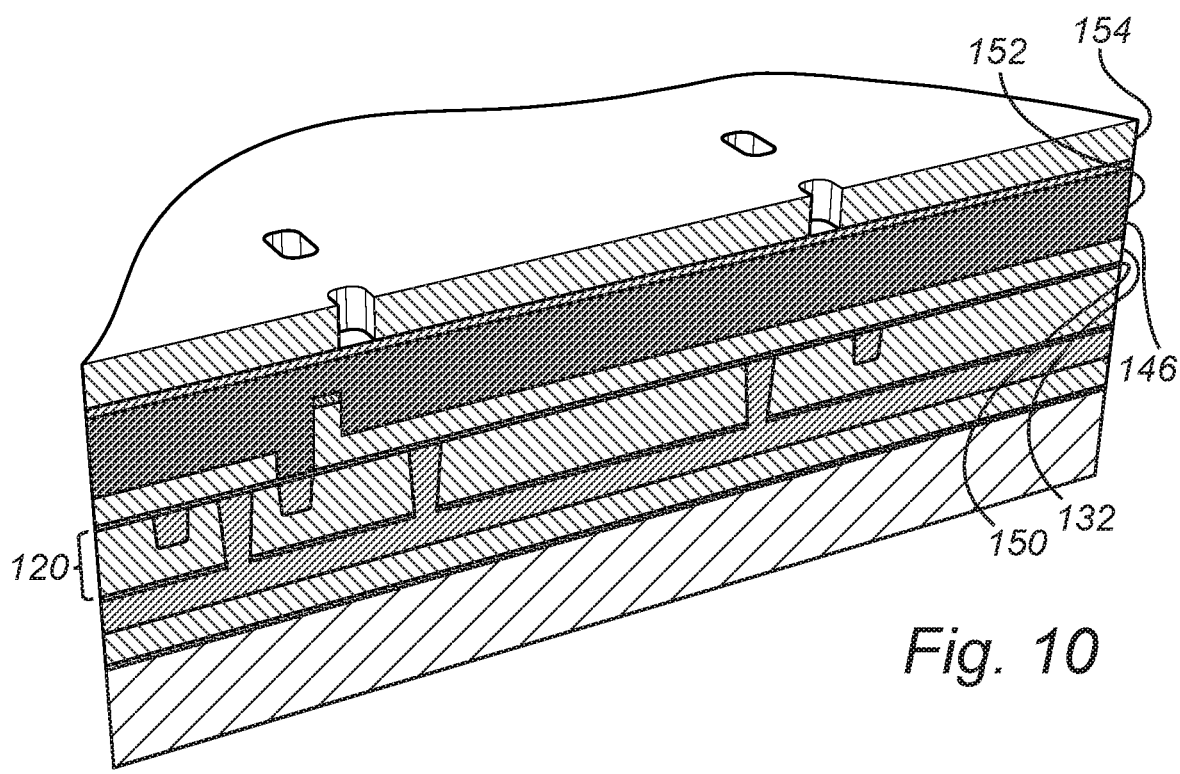
Figure 11:
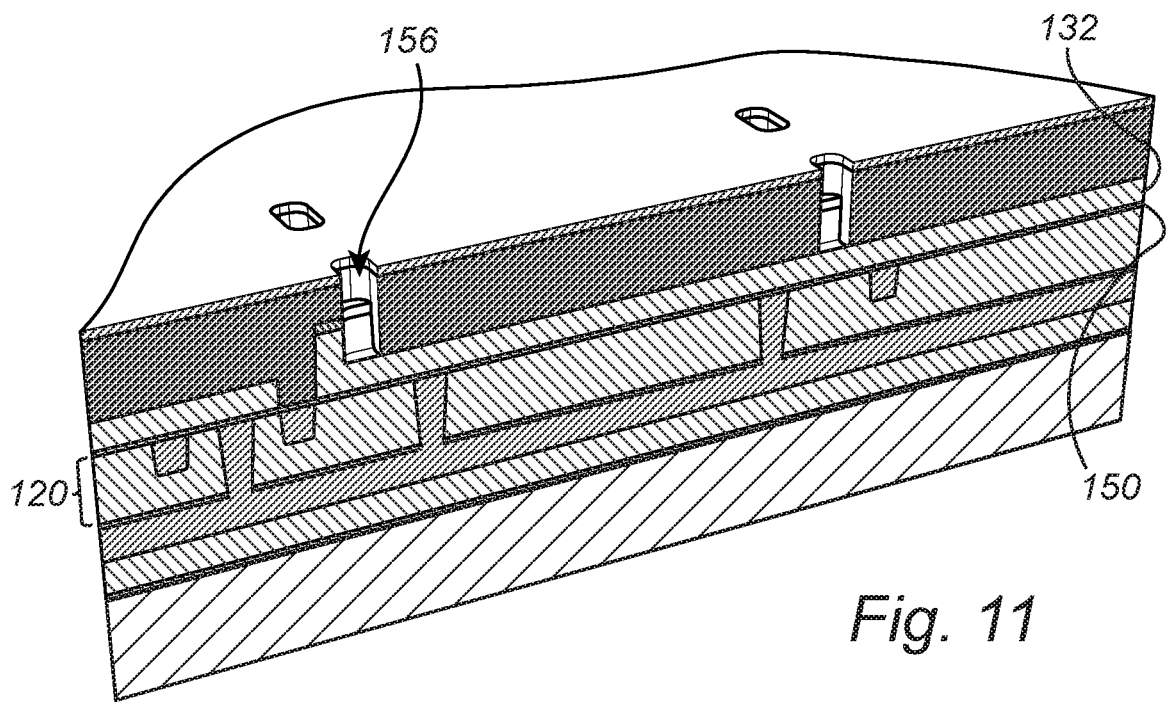
Figure 12:
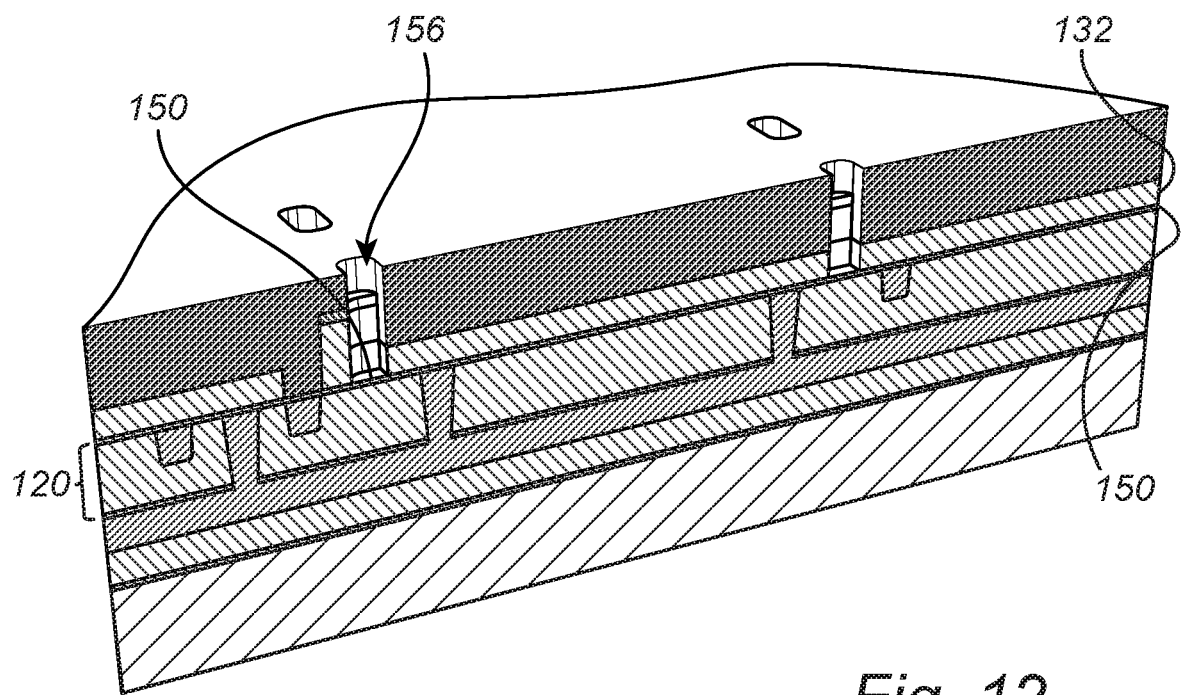

Referring now to FIGS. 10-12, a multi-level via mask 154 is formed above the first and second sacrificial material 146, 152. A multi-level via 156 is then formed. The forming of the multi-level via 156 includes etching of the third dielectric layer 132 to an etch stop 150 arranged at the second interconnection level 120. It may be noted that the multi-level via 156 is here only partially formed. It may be noted that several multi-level vias may be formed, as illustrated in the figures.

Figure 13:
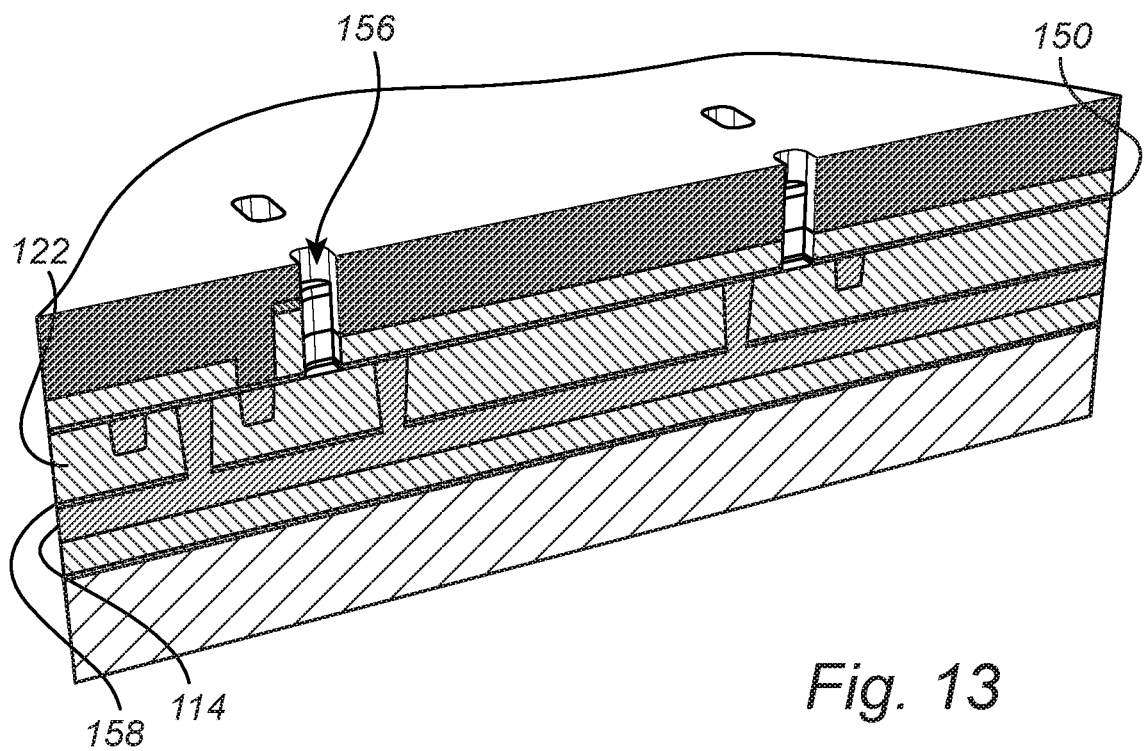
Figure 14:
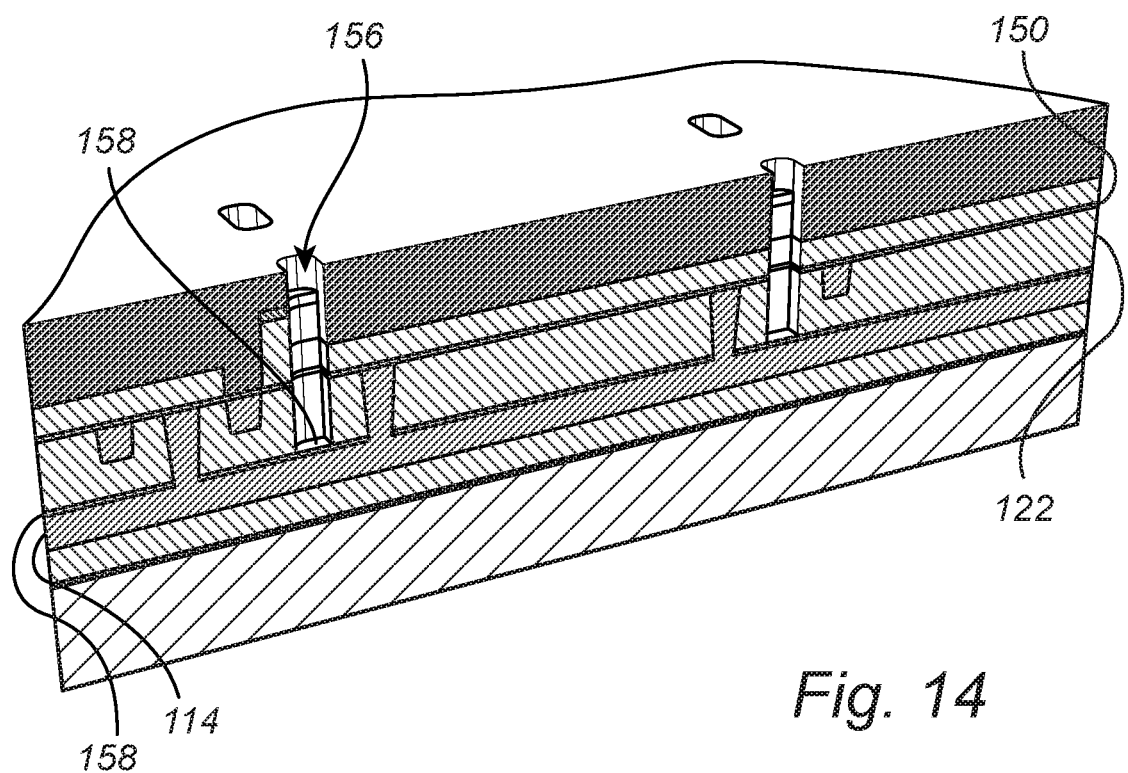

Referring now to FIGS. 13 and 14, the etch stop 150 is removed, and the continued etching of the multi-level via 156 is performed. The forming of the multi-level via 156 thus includes etching of the second dielectric layer 122 to an etch stop 158 arranged on the first conductive structure 114.

Figure 15:
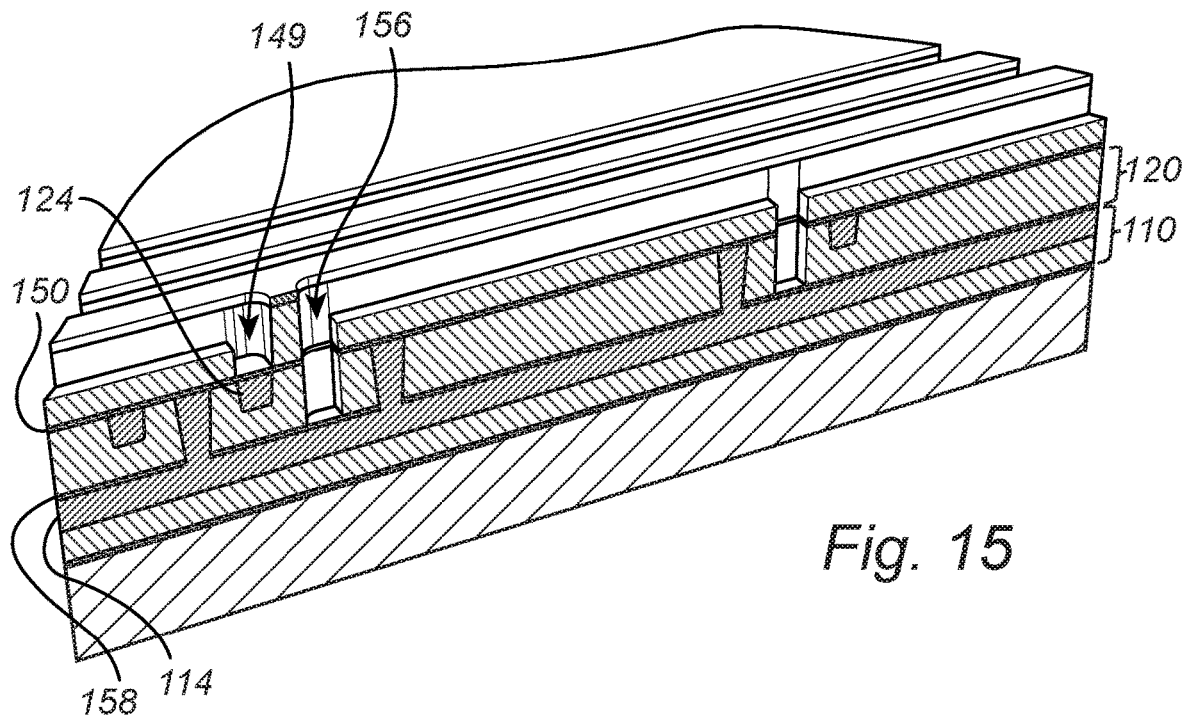
Figure 16:
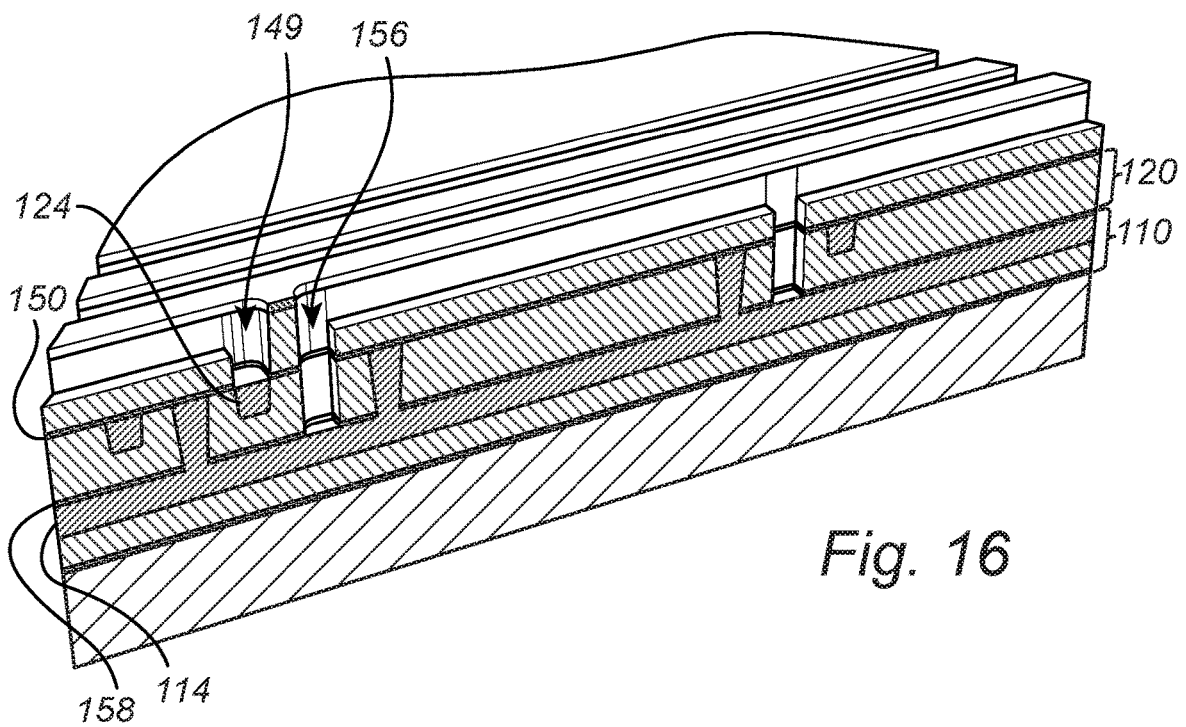

Referring now to FIGS. 15 and 16, the second sacrificial material is removed and, in case the first sacrificial material was never removed and replaced in the previous steps, the first sacrificial material is also removed here. The etch stop 150 arranged at the second interconnection level 120 on the second conductive structure 124, in the via 149, is then removed, along with the etch stop 158 arranged at the first interconnection level 110 on the first conductive structure 114 in the multi-level via 156.

Figure 17:
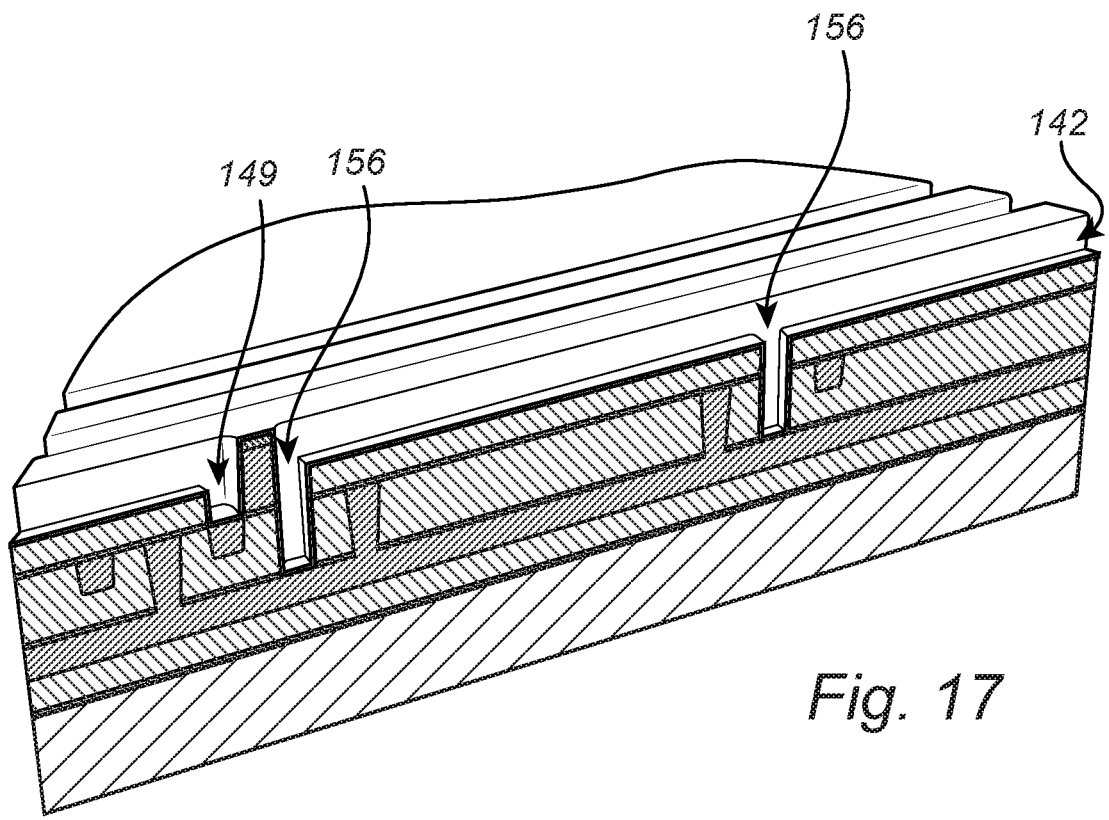
Figure 18:
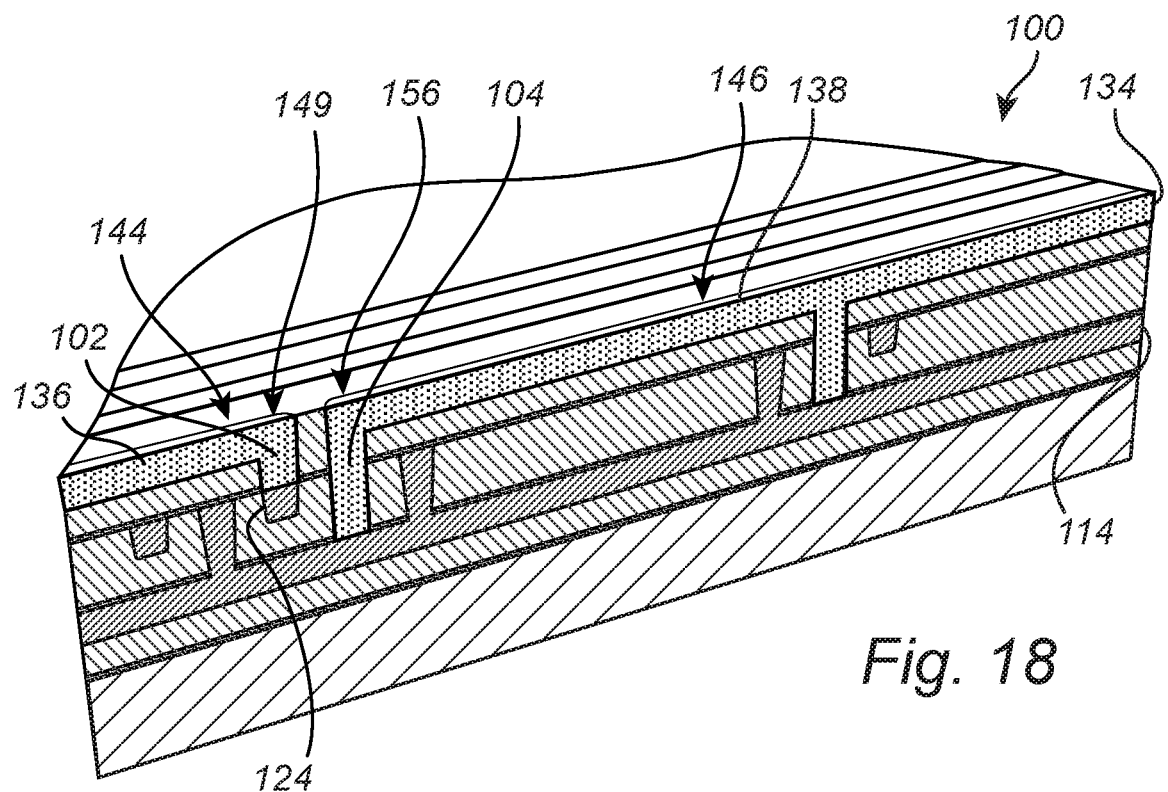

Referring now to FIGS. 17 and 18, a conductive material is deposited to at least partially fill the trench 142, thereby forming the third conductive structure 134 of the semiconductor device 100, and to at least partially fill the via 149, thereby forming a via structure 102 forming an electrical connection between the third conductive structure 134 and the second conductive structure 124, and to at least partially fill the multi-level via 156, thereby forming a multi-level via structure 104 forming an electrical connection between the third conductive structure 134 and the first conductive structure 114.

The conductive material in the sub-trench 144 may form a first conductive path 136, and the conductive material in the sub-trench 146 may form a second conductive path 138. It may further be noted that the multi-level via structure 104 is in connection with the filled trench, i.e. the third conductive structure 134, and that at least the multi-level via 156 and the trench 142 are filled in a single-step, also known as dual-damascene processing.

In the above the disclosed technology has mainly been described with reference to a limited number of examples. However, as is readily appreciated by a person skilled in the art, other examples than the ones disclosed above are equally possible within the scope of the disclosed technology.

What is claimed is:

1. A method of forming a multi-level interconnect structure in a semiconductor device comprising:
   a first interconnection level including a first dielectric layer and a first conductive structure;
   a second interconnection level arranged above the first interconnection level and including a second dielectric layer and a second conductive structure; and
   a third interconnection level arranged above the second interconnection level and including a third dielectric layer and a third conductive structure;
   wherein the method comprises:
   forming a trench in the third dielectric layer;
   providing a first sacrificial material in the trench; and thereafter
   forming a via extending through the third interconnection level to the second conductive structure;
   providing a second sacrificial material in the via;
   forming a multi-level via extending through the third interconnection level to the first conductive structure;

removing the first sacrificial material;
removing the second sacrificial material; and
depositing a conductive material at least partially filling:
- the trench, thereby forming the third conductive structure,
- the via, thereby forming a via structure forming an electrical connection between the third conductive structure and the second conductive structure, and
- the multi-level via, thereby forming a multi-level via structure forming an electrical connection between the third conductive structure and the first conductive structure.

2. The method according to claim 1, wherein forming the multi-level via is performed after the step of forming the via.

3. The method according to claim 1, wherein forming the via comprises etching to an etch stop arranged on the second conductive structure, and wherein the method further comprises removing the etch stop to expose the underlying second conductive structure.

4. The method according to claim 1, wherein forming the multi-level via comprises etching to an etch stop arranged on the first conductive structure, and wherein the method further comprises removing the etch stop to expose the underlying first conductive structure.

5. The method according to claim 1, wherein the first and second sacrificial material is the same type of material.

6. The method according to claim 1, wherein depositing the conductive material is performed in a single step.

7. The method according to claim 1, wherein the third conductive structure comprises a first and a second conductive path.

8. The method according to claim 7, wherein the via structure forms an electrical connection between the first conductive path and the second conductive structure, and wherein the multi-level via structure forms an electrical connection between the second conductive path and the first conductive structure.

9. The method according to claim 2, wherein forming the via comprises etching to an etch stop arranged on the second conductive structure, and wherein the method further comprises removing the etch stop to expose the underlying second conductive structure.

10. The method according to claim 9, wherein forming the multi-level via comprises etching to an etch stop arranged on the first conductive structure, and wherein the method further comprises removing the etch stop to expose the underlying first conductive structure.

11. The method according to claim 10, wherein the first and second sacrificial material is the same type of material.

12. The method according to claim 11, wherein depositing the conductive material is performed in a single step.

13. The method according to claim 12, wherein the third conductive structure comprises a first and a second conductive path.

14. The method according to claim 13, wherein the via structure forms an electrical connection between the first conductive path and the second conductive structure, and wherein the multi-level via structure forms an electrical connection between the second conductive path and the first conductive structure.

* * * * *